United States Patent
Kusaka

(10) Patent No.: US 9,484,242 B2
(45) Date of Patent: Nov. 1, 2016

(54) FLUID PRESSURE CYLINDER

(71) Applicant: SMC Corporation, Chiyoda-ku (JP)

(72) Inventor: Hiroshi Kusaka, Toride (JP)

(73) Assignee: SMC CORPORATION, Chiyoda-ku (JP)

( * ) Notice: Subject to any disclaimer, the term of this patent is extended or adjusted under 35 U.S.C. 154(b) by 398 days.

(21) Appl. No.: 14/265,511

(22) Filed: Apr. 30, 2014

(65) Prior Publication Data

US 2014/0352526 A1    Dec. 4, 2014

(30) Foreign Application Priority Data

May 28, 2013    (JP) ................................. 2013-111481

(51) Int. Cl.
| | | |
|---|---|---|
| *F15B 15/20* | (2006.01) | |
| *H01L 21/683* | (2006.01) | |
| *F15B 15/14* | (2006.01) | |
| *F15B 15/22* | (2006.01) | |
| *F16J 10/02* | (2006.01) | |

(52) U.S. Cl.
CPC ......... *H01L 21/6838* (2013.01); *F15B 15/149* (2013.01); *F15B 15/1471* (2013.01); *F15B 15/228* (2013.01); *F16J 10/02* (2013.01)

(58) Field of Classification Search
CPC   F15B 15/1471; F15B 15/149; F15B 15/228; H01L 21/6838
See application file for complete search history.

(56) References Cited

U.S. PATENT DOCUMENTS 7,845,060 B2 * 12/2010 Baur ................... F15B 15/1471
                                                                                     92/165 R
8,256,961 B2 * 9/2012 Maffeis ................. F15B 15/149
                                                                                      384/49

FOREIGN PATENT DOCUMENTS

KR        10-0840271        6/2008

* cited by examiner

*Primary Examiner* — Michael Leslie

(74) *Attorney, Agent, or Firm* — Oblon, McClelland, Maier & Neustadt, L.L.P.

(57) ABSTRACT

A fluid pressure cylinder includes a displacement member, which is displaceable on an end side of a body, and a connecting body, which is connected to a piston rod of a cylinder unit, is inserted via a spring in a block body of the displacement member. A suction rod is connected substantially in parallel with the connecting body and a buffer rod connected to the connecting body. In addition, in a state where downward displacement of the block body is restricted, when additional loads are applied, the buffer rod is displaced relatively with respect to the block body in opposition to an elastic force of the spring, whereby an interval in a radial direction between a bushing and the buffer rod is enlarged.

9 Claims, 8 Drawing Sheets

FLUID PRESSURE CYLINDER

CROSS-REFERENCE TO RELATED APPLICATION

This application is based upon and claims the benefit of priority from Japanese Patent Application No. 2013-111481 filed on May 28, 2013, the contents of which are incorporated herein by reference.

BACKGROUND OF THE INVENTION

1. Field of the Invention

The present invention relates to a fluid pressure cylinder in which a piston is displaced along an axial direction under the supply of a pressure fluid.

2. Description of the Related Art

Heretofore, as a means for transporting workpieces, for example, a fluid pressure cylinder has been used having a piston that is displaced under the supply of a pressure fluid. With such a fluid pressure cylinder, for example, a plate is disposed on an end of a piston rod, which is connected to the piston, and a suction pad, which is capable of attracting a workpiece, is installed on the plate. In addition, the piston is displaced by the pressure fluid that is supplied to the fluid pressure cylinder, whereby the plate moves toward the side of the workpiece, and by coming into abutment against the workpiece, the workpiece is attracted by suction to the suction pad. At this time, because a buffering mechanism is disposed on the plate, which is capable of buffering shocks (loads) applied in an axial direction, when the plate comes into abutment against the workpiece, application of loads with respect to the workpiece is suppressed by the buffering mechanism.

SUMMARY OF THE INVENTION

For example, with the fluid pressure cylinder disclosed in Korean Patent Registration No. 10-0840271, a piston rod and a suction pipe, which are disposed in parallel, are connected respectively to the same plate. Therefore, for example, in the fluid pressure cylinder, in the case that the piston rod and the suction pipe are not in parallel due to assembly conditions or manufacturing variances, or in the case that the piston rod, etc., is eccentric with respect to a hole in the plate, the piston rod, etc., tends to bite into a bushing that is disposed in the hole, and a locked condition is brought about in which the buffering mechanism cannot operate properly. As a result, when the plate is moved toward the workpiece and brought into abutment with the workpiece, loads are applied with respect to the workpiece without the buffering mechanism functioning properly. In the case of a fragile workpiece, such as a semiconductor chip or the like, for example, damage tends to occur to the workpiece.

For solving the aforementioned problems, although it might be considered to increase the degree of parallelism between the piston rod and the suction pipe, or in addition to securing such parallelism, to increase the size of a clearance between the bushing and the suction pipe and the piston rod for thereby absorbing any deviation therebetween, if the clearance is increased in size, the plate rotates as a result of the piston rod and the suction pipe deviating from their predetermined positions, accompanied by rotation of the workpiece that is retained by the suction pad. As a result, in the case that rotation of the workpiece is to be regulated during transport thereof, the workpiece cannot be placed at a desired position.

A general object of the present invention is to provide a fluid pressure cylinder in which rotational motion of a displacement block can be suppressed while enabling movement of the displacement block smoothly in an axial direction.

A fluid pressure cylinder according to the present invention includes:

a body having therein a cylinder chamber to which a driving fluid is supplied;

a cylinder unit disposed in the body and which has a piston disposed displaceably in the cylinder chamber, and a piston rod connected to the piston;

a supply rod disposed displaceably and substantially in parallel with the piston rod in the body and having a fluid passage into which a workpiece retaining fluid is supplied, with a retaining member for retaining a workpiece being installed on an end of the supply rod, the retaining member communicating with the fluid passage;

a displacement block connected to ends of the supply rod and the piston rod, and which is displaced under a displacement action of the piston; and a buffer mechanism, which buffers loads applied to the displacement block, and is disposed between the displacement block and the piston rod, wherein the buffer mechanism includes a buffer rod, which is disposed coaxially with the piston rod and is inserted through a hole of the displacement block, an outer circumferential surface of the buffer rod being formed in a tapered shape, which is reduced gradually in diameter toward the body.

According to the present invention, the piston rod of the cylinder unit, which is disposed displaceably in the interior of the body, and the supply rod, which is disposed displaceably in the body and has, on an end thereof, the retaining member capable of retaining a workpiece, are disposed substantially in parallel, with the displacement block being connected to ends of the supply rod and the piston rod. Together therewith, the buffer mechanism, which is disposed between the displacement block and the piston rod, is disposed coaxially with the piston rod, and includes the buffer rod, which is inserted through a hole of the displacement block. Further, as a result of the outer circumferential surface of the buffer rod being formed in a tapered shape, which is reduced gradually in diameter toward the body, it is possible for loads applied to the displacement block to be buffered.

Consequently, when the retaining member comes into abutment against and retains the workpiece under a driving action of the cylinder unit, since the interval in the radial direction between the displacement block and the buffer rod is kept small until abutment against the workpiece takes place, the buffer rod is maintained along the axial direction with high accuracy, and rotational movement of the displacement block about the supply rod can be suppressed.

On the other hand, after the retaining member has come into abutment against the workpiece, in the case that additional loads are applied toward the side of the workpiece, the buffer rod is displaced relatively in the axial direction with respect to the displacement block, whereby the interval in the radial direction between the buffer rod and the hole of the displacement block can be enlarged. Therefore, for example, even in the case that the hole of the displacement block becomes eccentric or offset with respect to the buffer rod, since such eccentricity can be absorbed by enlargement of the interval upon displacement of the displacement block, in any case, the buffer rod can be displaced smoothly in the axial direction with respect to the displacement block.

More specifically, rotational movement of the displacement block about the supply rod is suppressed by the buffer mechanism, while in addition, the buffer rod can smoothly be displaced relatively in the axial direction with respect to the displacement block, and loads that occur upon abutment against the workpiece can suitably be absorbed.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

Figure 1:
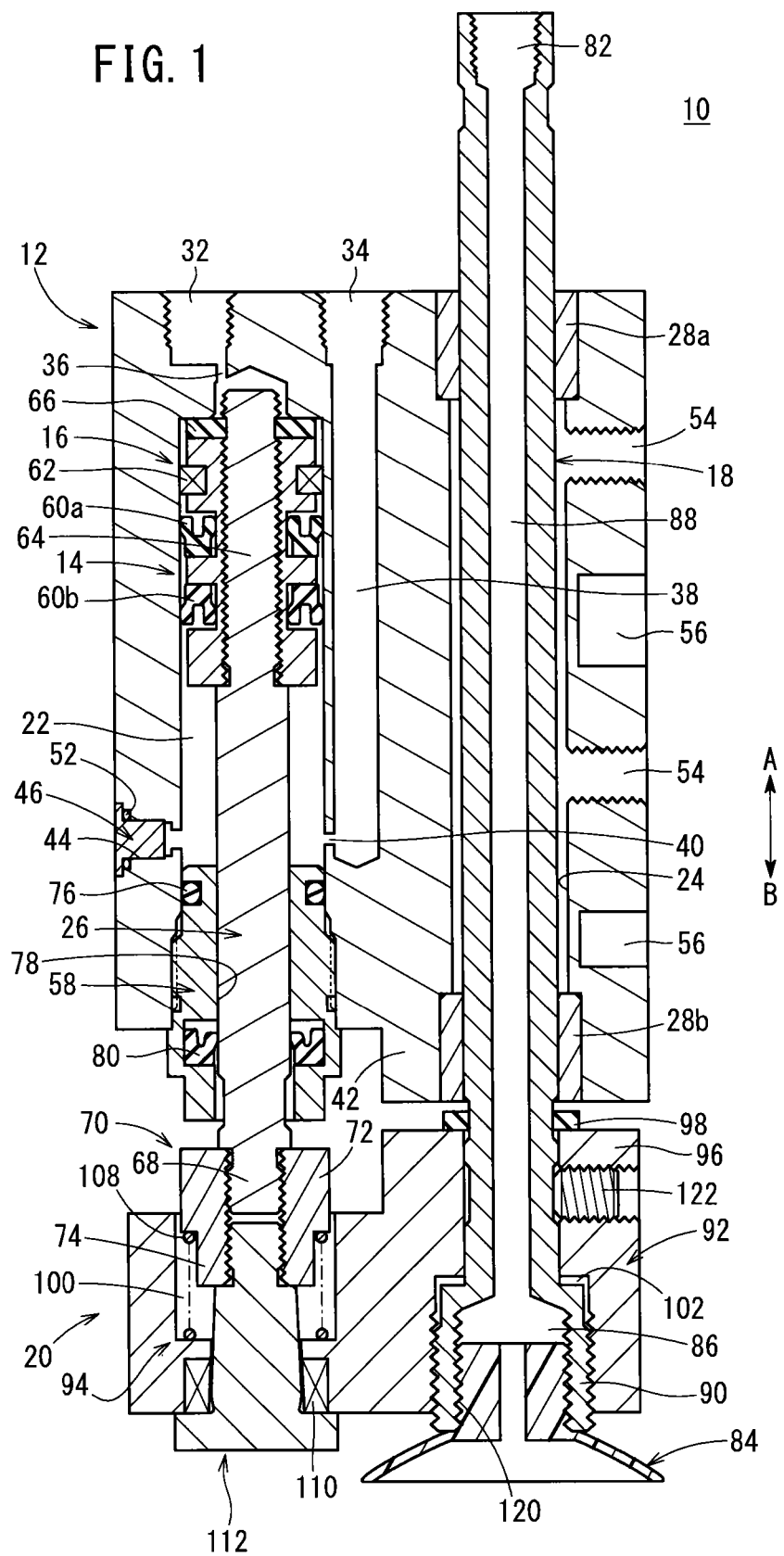
FIG. 1 is an overall cross sectional view of a fluid pressure cylinder according to an embodiment of the present invention.

As shown in FIG. 1, a fluid pressure cylinder 10 according to the present invention includes a body 12, a cylinder unit 16 having a piston 14 disposed displaceably along an axial direction (the direction of arrows A and B) of the body 12, a suction rod (supply rod) 18 disposed substantially in parallel with the piston 14, and a displacement member 20 connected to the cylinder unit 16 and the suction rod 18, and which is disposed so as to be capable of moving closer toward and separating away from the body 12. A case will be described in which the displacement member 20 is used in a downwardly located orientation on the fluid pressure cylinder 10.

Figure 2:
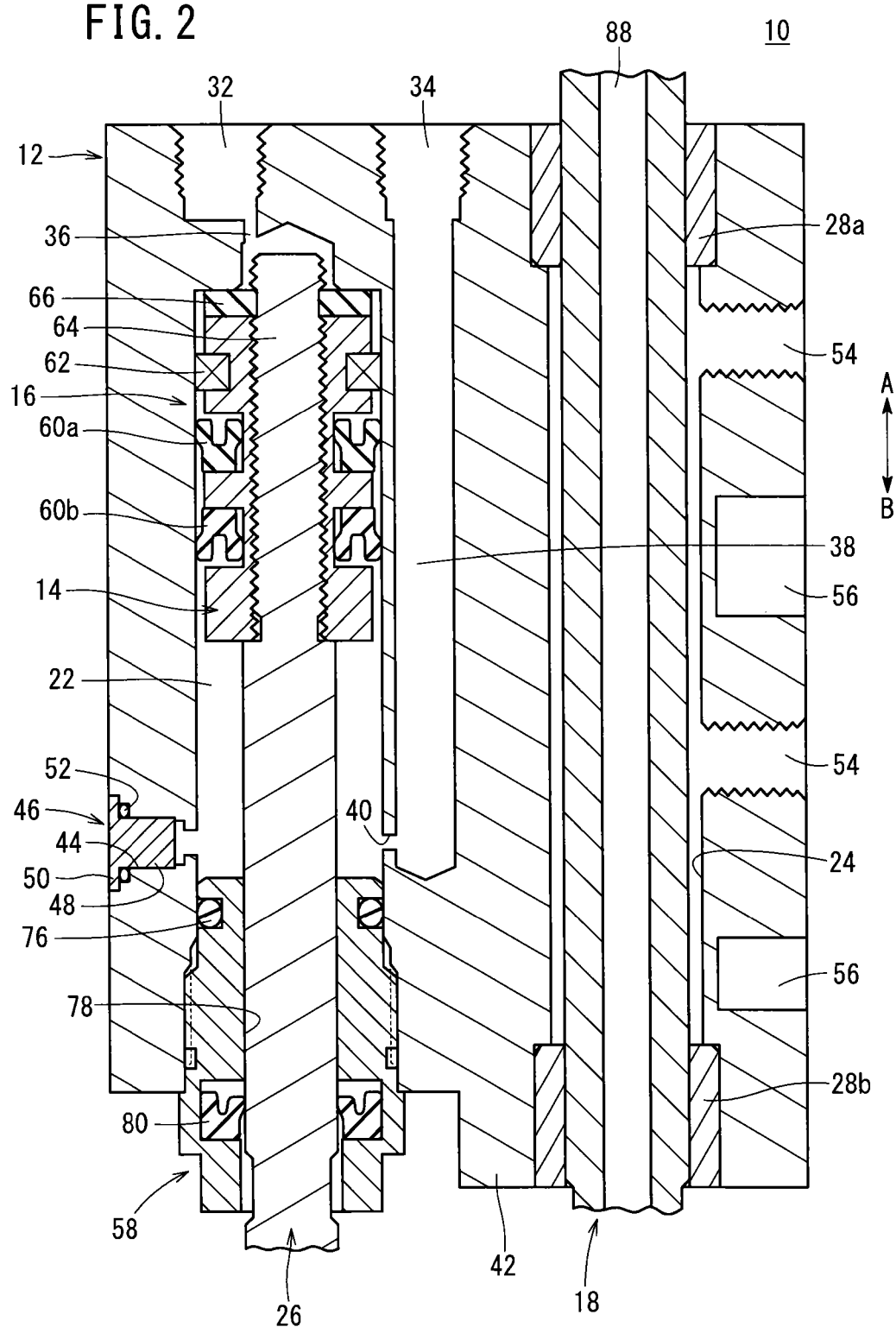
FIG. 2 is an enlarged cross sectional view showing a vicinity of a cylinder unit in the fluid pressure cylinder of FIG. 1.

As shown in FIGS. 1 and 2, the body 12 is formed with a substantially rectangular shape in cross section, for example, from a metal material. A first cylinder hole (cylinder chamber) 22 and a first rod hole 24 are formed in the interior of the body 12 and penetrate through the body 12 in the axial direction (the direction of arrows A and B). The first cylinder hole 22 and the first rod hole 24 are separated by a predetermined distance and are formed substantially in parallel. In addition, the first rod hole 24 penetrates from one end to another end of the body 12, whereas the first cylinder hole 22 opens on the other end of the body 12.

In addition, the piston 14 and a piston rod 26 that make up the cylinder unit 16 are disposed displaceably in the first cylinder hole 22. On the other hand, the suction rod 18 is inserted through the first rod hole 24, such that the suction rod 18 is supported displaceably in the axial direction (the direction of arrows A and B) by a pair of bearings 28a, 28b, which are disposed in the one end and the other end of the first rod hole 24. The bearings 28a, 28b are cylindrically shaped, with the suction rod 18 being inserted through interior portions thereof.

First and second ports 32, 34, which supply a pressure fluid (driving fluid) to the first cylinder hole 22, are formed in the one end of the body 12. The first port 32 communicates through a first communication passage 36 with one end of the first cylinder hole 22. The second port 34 is connected to and communicates with a portion in the vicinity of the other end of the first cylinder hole 22, through a connecting passage 38 and a second communication passage 40, the connecting passage 38 being formed between the first cylinder hole 22 and the first rod hole 24, the second communication passage 40 being formed on an end of the connecting passage 38.

Stated otherwise, via the first and second communication passages 36, 40, the first port 32 and the second port 34 are connected respectively to one end side (in the direction of the arrow A) and the other end side (in the direction of the arrow B) of the piston 14 in the first cylinder hole 22.

Additionally, a non-illustrated pressure fluid supply source is connected via tubes to the first and second ports 32, 34, and pressure fluid is supplied selectively to one of the first and second ports 32, 34 under a switching action of a switching means. Owing thereto, the pressure fluid, which is supplied to the first port 32 or the second port 34, is introduced into the first cylinder hole 22 through the first and second communication passages 36, 40.

Further, in the other end of the body 12, a region where the first rod hole 24 is formed projects a predetermined length in the axial direction (the direction of the arrow B) with respect to a region where the first cylinder hole 22 is formed, whereby the other end of the body 12 includes a first projection 42. More specifically, the other end of the body 12 is formed in a stepped shape.

A machining hole 44, which is used when the second communication passage 40 is fabricated, opens on one side surface of the body 12 adjacent to the first cylinder hole 22. The machining hole 44 is formed perpendicularly to the first cylinder hole 22. In addition, for example, a non-illustrated drill is inserted through the machining hole 44 from the exterior of the body 12, whereby the second communication passage 40 is cut perpendicularly to the first cylinder hole 22, and is formed to establish communication between the first cylinder hole 22 and the connecting passage 38.

A plug 46, which is formed from a metal material, for example, is press-inserted into the machining hole 44 after the second communication passage 40 has been formed. An expanded-diameter lid portion 50, which is expanded in diameter with respect to a shaft portion 48 of the plug 46, is mounted on an outer side of the body 12. At this time, the plug 46 is mounted so as not to project outwardly from the side surface of the body 12, and by mounting an o-ring 52 between the machining hole 44 and the lid portion 50, leakage of pressure fluid or lubricating oil or the like, which passes between the machining hole 44 and the plug 46, can reliably be prevented.

Instead of the plug 46, for example, the machining hole 44 may be closed by inserting a steel ball (not shown) into the machining hole 44. However, by closing the machining hole 44 using the plug 46 and the o-ring 52, leakage of lubricating oil or the like can be prevented more reliably.

On the other hand, in the other side surface of the body 12 adjacent to the first rod hole 24, for example, plural attachment holes 54 and locating holes 56 are formed, which are used when fixing the fluid pressure cylinder 10 to a transport arm or the like.

The cylinder unit 16 is disposed in the interior of the body 12, and includes a piston 14, which is disposed in the first cylinder hole 22, the piston rod 26 connected to the piston 14, and a rod cover 58 that supports the piston rod 26 displaceably.

The piston 14 is formed in a cylindrical shape, for example, with a pair of piston packings 60a, 60b and a wear ring 62 being mounted respectively via annular grooves on the outer circumferential surface of the piston 14. In addition, the piston packings 60a, 60b and the wear ring 62 are arranged in sliding contact with the inner circumferential surface of the first cylinder hole 22.

Further, in the interior of the piston 14, a piston hole is formed that penetrates in the axial direction (the direction of arrows A and B), and one end of the piston rod 26 is inserted through the interior thereof.

The piston rod 26 is made up from a shaft having a predetermined length in the axial direction (the direction of arrows A and B). A first connector 64, which is formed on one end of the piston rod 26 and is smaller in diameter than a central portion thereof, is connected by screw-engagement in the piston hole of the piston 14. A damper 66 is mounted on a region that projects from the one end of the piston 14. The damper 66, for example, is made from an elastic material such as rubber or the like, which prevents direct contact when the piston 14 is displaced toward the one end side of the first cylinder hole 22 (in the direction of the arrow A) under a displacement action of the piston 14, and further prevents the occurrence of shocks and shock noises at the displacement end position.

Further, a second connector 68 formed on the other end of the piston rod 26 is connected by screw-insertion into a connecting body 70, to be described below, and is displaced integrally therewith in the axial direction (the direction of arrows A and B) upon displacement of the piston rod 26.

Figure 3:
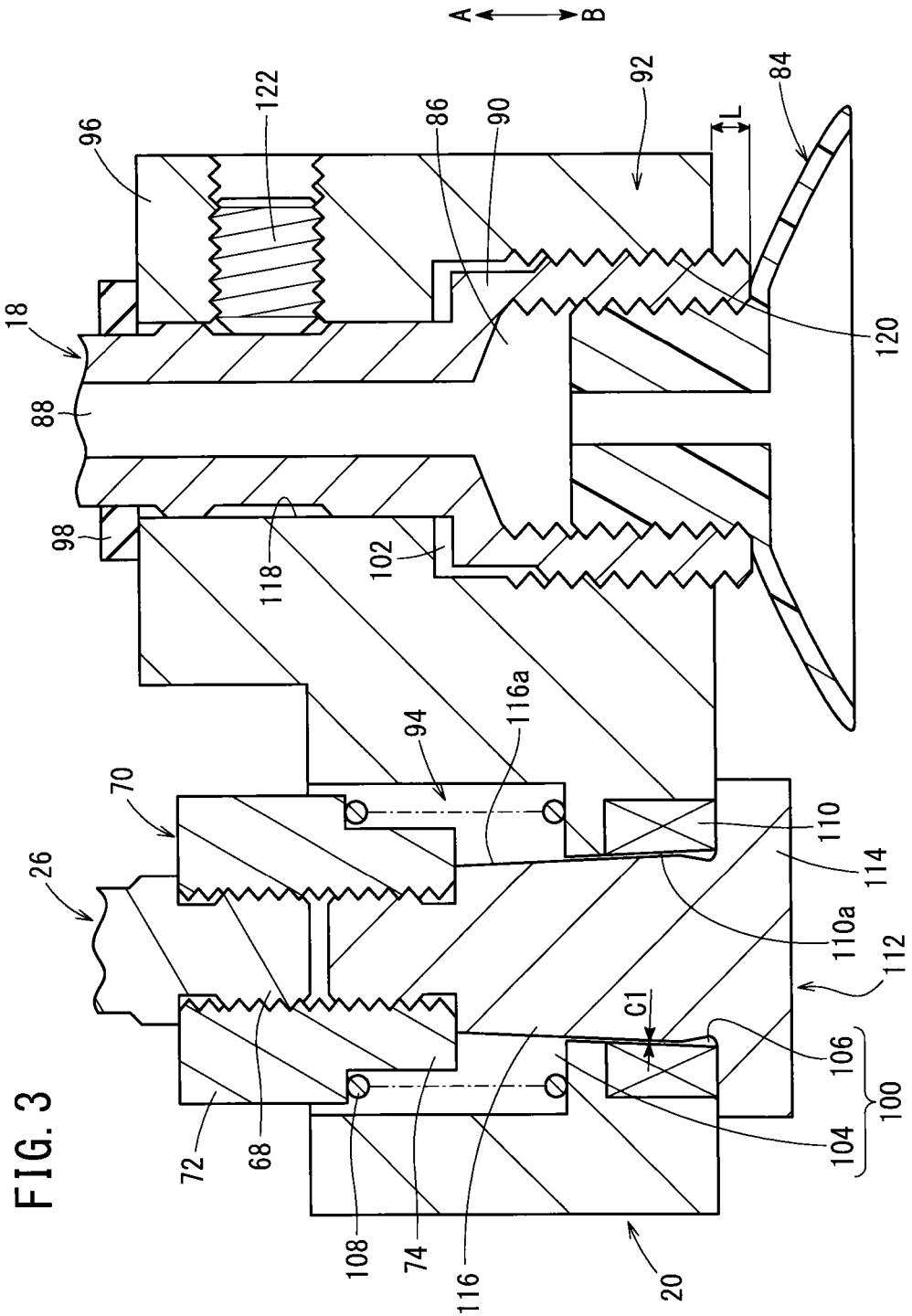
FIG. 3 is an enlarged cross sectional view showing a vicinity of a displacement member in the fluid pressure cylinder of FIG. 1.
Figure 4:
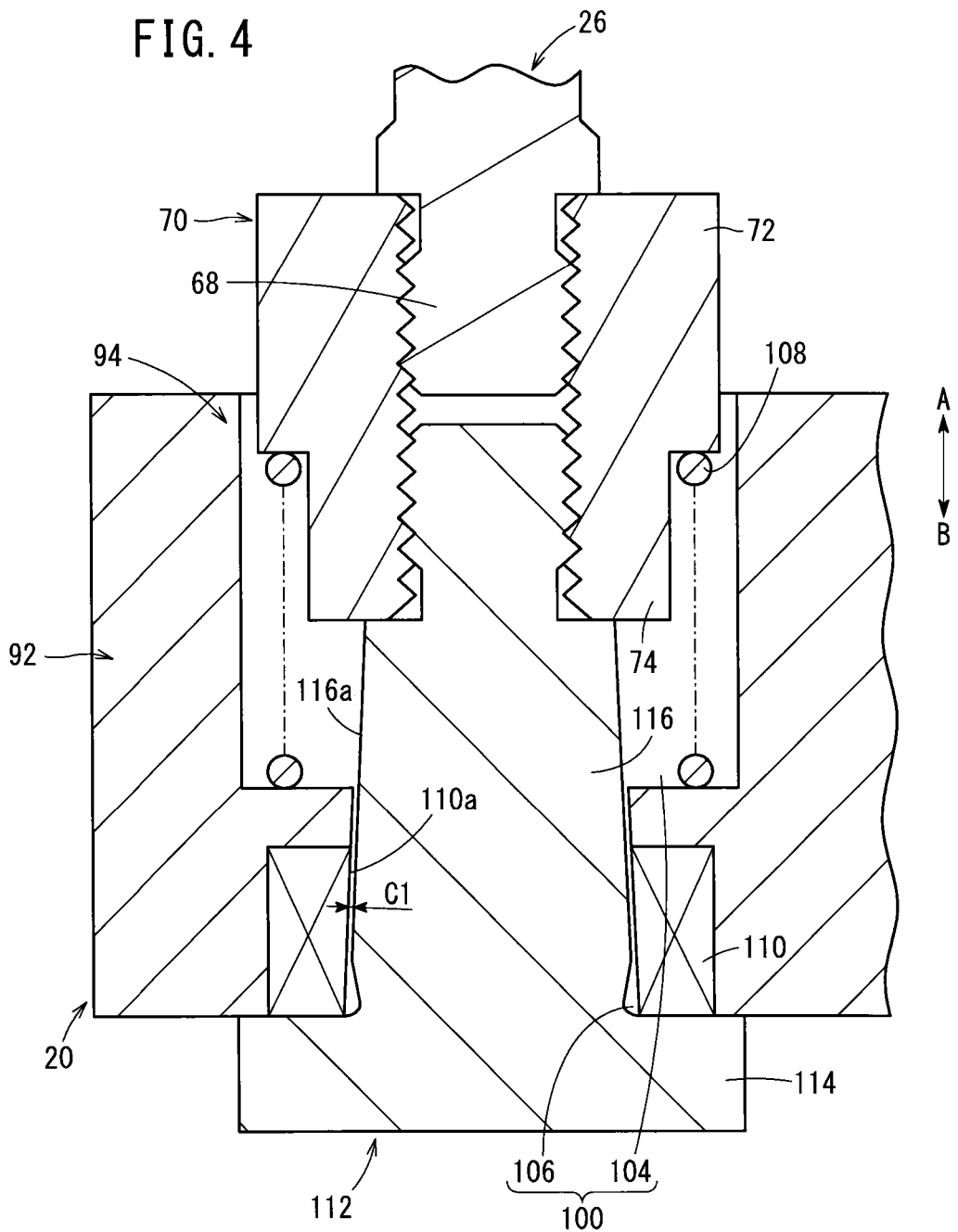
FIG. 4 is an enlarged cross sectional view showing a vicinity of a buffer rod shown in FIG. 3.

The connecting body 70 is formed in a cylindrical shape from a metal material, for example, and as shown in FIGS. 1, 3 and 4, includes a large diameter portion 72 in which the piston rod 26 is screw-engaged in the interior thereof, and a small diameter portion 74 adjacent to the large diameter portion 72 and which is connected to a later-described buffer rod 112. Additionally, the connecting body 70 is arranged coaxially with the piston 14 and the piston rod 26, and between the body 12 and the displacement member 20, such that the large diameter portion 72 is positioned on the side of the body 12 (in the direction of the arrow A), and the small diameter portion 74 is positioned on the side of the displacement member 20 (in the direction of the arrow B).

As shown in FIGS. 1 and 2, the rod cover 58 is formed in a cylindrical shape from a metal material, for example, and is screw-engaged with the other end side (in the direction of the arrow B) of the first cylinder hole 22 through a threaded part that is formed on the outer circumferential surface of the rod cover 58. A seal ring 76, which is mounted through an annular groove on the outer circumferential surface, abuts against the inner circumferential wall of the first cylinder hole 22. Consequently, leakage of pressure fluid from between the first cylinder hole 22 and the rod cover 58 is prevented.

Further, in the interior of the rod cover 58, a through hole 78 is formed that penetrates therethrough in the axial direction (the direction of the arrows A and B). The piston rod 26 is inserted displaceably in the through hole 78, and by abutment of a rod packing 80, which is mounted on the inner circumferential surface of the rod cover 58, against the outer circumferential surface of the piston rod 26, leakage of pressure fluid from between the rod cover 58 and the piston rod 26 is prevented. Moreover, an end of the rod cover 58 is disposed so as to project a predetermined length from the other end portion of the body 12.

The suction rod 18 is made up from a shaft having a predetermined length in the axial direction (the direction of arrows A and B). A negative pressure supply port 82, to which a non-illustrated negative pressure supply source is connected, opens on one end of the suction rod 18, and a connection port 86 (see FIG. 1), which is connected to a suction pad (retaining member) 84, for example, opens on the other end of the suction rod 18. In addition, the negative pressure supply port 82 and the connection port 86 are placed in communication through a supply passage (fluid passage) 88 that is formed to extend in the axial direction (the direction of arrows A and B) in the interior of the suction rod 18, for example, for thereby supplying the negative pressure fluid (workpiece retaining fluid) with respect to the suction pad 84.

As shown in FIGS. 1 and 3, on the other end of the suction rod 18, a connector 90 is formed that is expanded in diameter in a radial outward direction. The connection port 86 is formed in the center of the connector 90, and screw threads are formed along the axial direction on the outer circumferential surface of the connector 90.

In addition, a central vicinity along the axial direction (the direction of arrows A and B) of the suction rod 18 is inserted through the first rod hole 24 of the body 12, and the suction rod 18 is disposed for displacement along the axial direction (the direction of arrows A and B) by the pair of bearings 28a, 28b. Further, one end of the suction rod 18 projects beyond the one end of the body 12, and the other end thereof projects beyond the other end of the body 12. In addition, a later-described block body (displacement block) 92 of the displacement member 20 is connected to the other end of the suction rod 18.

The displacement member 20 includes the block body 92, and a buffer mechanism 94, which is disposed in the interior of the block body 92, for buffering loads applied in the axial direction (the direction of arrows A and B).

The block body 92 has a thickness dimension substantially the same as that of the body 12, and one end thereof is formed in a stepped shape having a second projection 96 that projects toward the body 12 (in the direction of the arrow A). As shown in FIG. 1, the second projection 96 is disposed in facing relation to the first projection 42 of the body 12, and the suction rod 18 is inserted through the interior of an annular damper 98, which is disposed on the end surface of the second projection 96. The damper 98, for example, is made from an elastic material such as rubber or the like, which prevents direct contact when the second projection 96 is displaced toward the first projection 42 (in the direction of the arrow A) under a displacement action of the displacement member 20, and further prevents the occurrence of shocks and shock noises at the time of contact.

On the other hand, the other end of the block body 92 is formed in a flat planar shape, which is perpendicular with respect to the axial direction (the direction of arrows A and B).

The block body 92 includes a second cylinder hole 100 formed coaxially with the first cylinder hole 22 and through which the connecting body 70 is inserted, and a second rod hole 102, which is formed substantially in parallel with the second cylinder hole (hole) 100 and through which the suction rod 18 is inserted.

As shown in FIGS. 3 and 4, the second cylinder hole 100 includes a first hole portion 104 formed on the side of the body 12 (in the direction of the arrow A) and through which the second connector 68 is inserted, and a second hole portion 106, which is smaller in diameter than the first hole portion 104, and is formed on the other end side (in the direction of the arrow B). A spring 108 is interposed between a stepped part of the connecting body 70 and a boundary surface between the first hole portion 104 and the second hole portion 106. The spring 108 has an elastic force that serves to bias the block body 92 in a direction (the direction of the arrow B) away from the connecting body 70. A part of the connecting body 70 normally is inserted into the first hole portion 104.

Further, on the other end of the second hole portion 106, an annular groove is included, which is recessed in a radial outward direction on the inner circumferential wall of the second hole portion 106, and a cylindrical bushing 110 is disposed in the annular groove. The bushing 110 is formed from a metal material such as an aluminum alloy or the like, and an inner circumferential surface 110a thereof is formed in a tapered shape, which is gradually reduced in diameter toward the body 12 (in the direction of the arrow A). In addition, a buffer rod 112, which constitutes part of the buffer mechanism 94, is inserted through the second hole portion 106.

Figure 5:
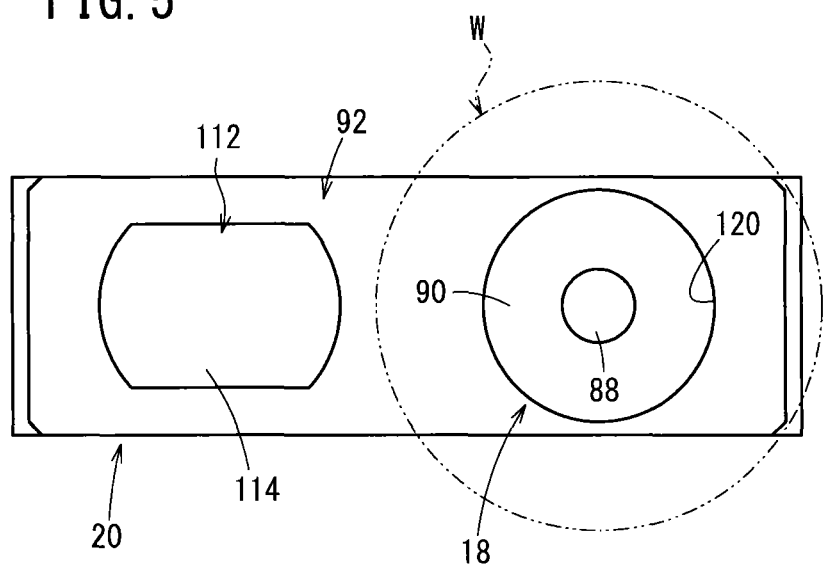
FIG. 5 is a front view of the displacement member in the fluid pressure cylinder of FIG. 1.

As shown in FIGS. 3 through 5, the buffer rod 112 includes a head portion 114, which is formed with an oblong shape in cross section, for example, and a rod portion 116, which extends in the axial direction (the direction of the arrow A) from the center of the head portion 114. In addition, the end of the rod portion 116 is inserted through the second hole portion 106, and is inserted into and connected by way of screw-engagement with the interior of the connecting body 70, in a condition in which the head portion 114 is arranged on the outside of the other end of the block body 92.

Further, an outer circumferential surface 116a of the rod portion 116 is formed in a tapered shape, which is reduced in diameter gradually toward the connecting body 70 (in the direction of the arrow A), and as shown in FIG. 4, a first clearance C1 having a substantially constant interval is provided along the axial direction between the outer circumferential surface 116a of the rod portion 116 and the inner circumferential surface 110a of the bushing 110, which is disposed on the outer circumferential side of the rod portion 116. More specifically, the angle of inclination of the outer circumferential surface 116a on the rod portion 116 is formed with substantially the same angle as the angle of inclination on the inner circumferential surface 110a of the bushing 110, such that the outer circumferential surface 116a and the inner circumferential surface 110a lie substantially in parallel.

In addition, the block body 92 is pressed toward the side of the head portion 114 (in the direction of the arrow B) under an elastic action of the spring 108, and the end surface of the block body 92 is stopped by abutment against the head portion 114.

Figure 6:
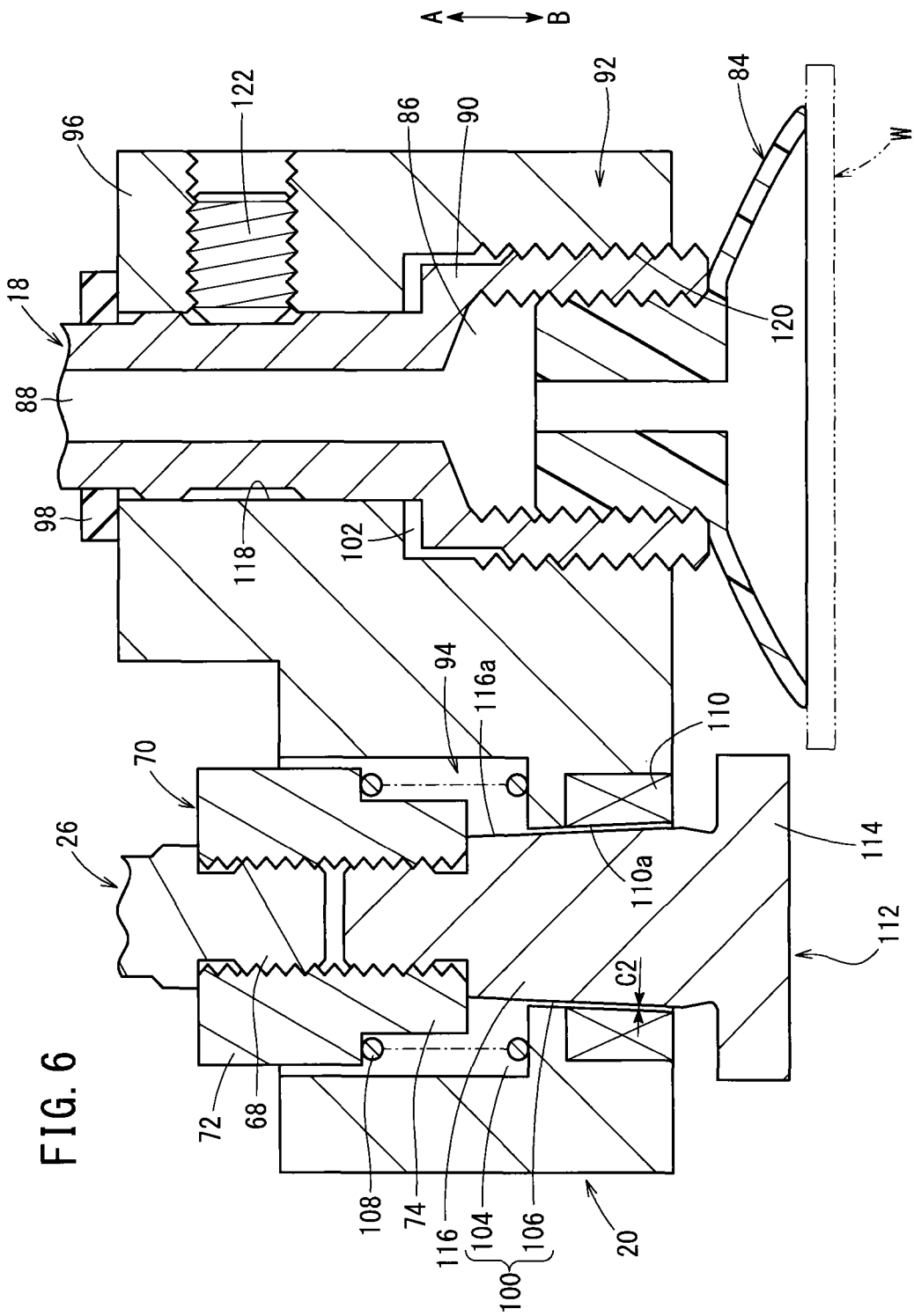
FIG. 6 is an enlarged cross sectional view showing a condition in which the displacement member of the fluid pressure cylinder shown in FIG. 2 abuts against a workpiece and is pressed toward a body.
Figure 7:
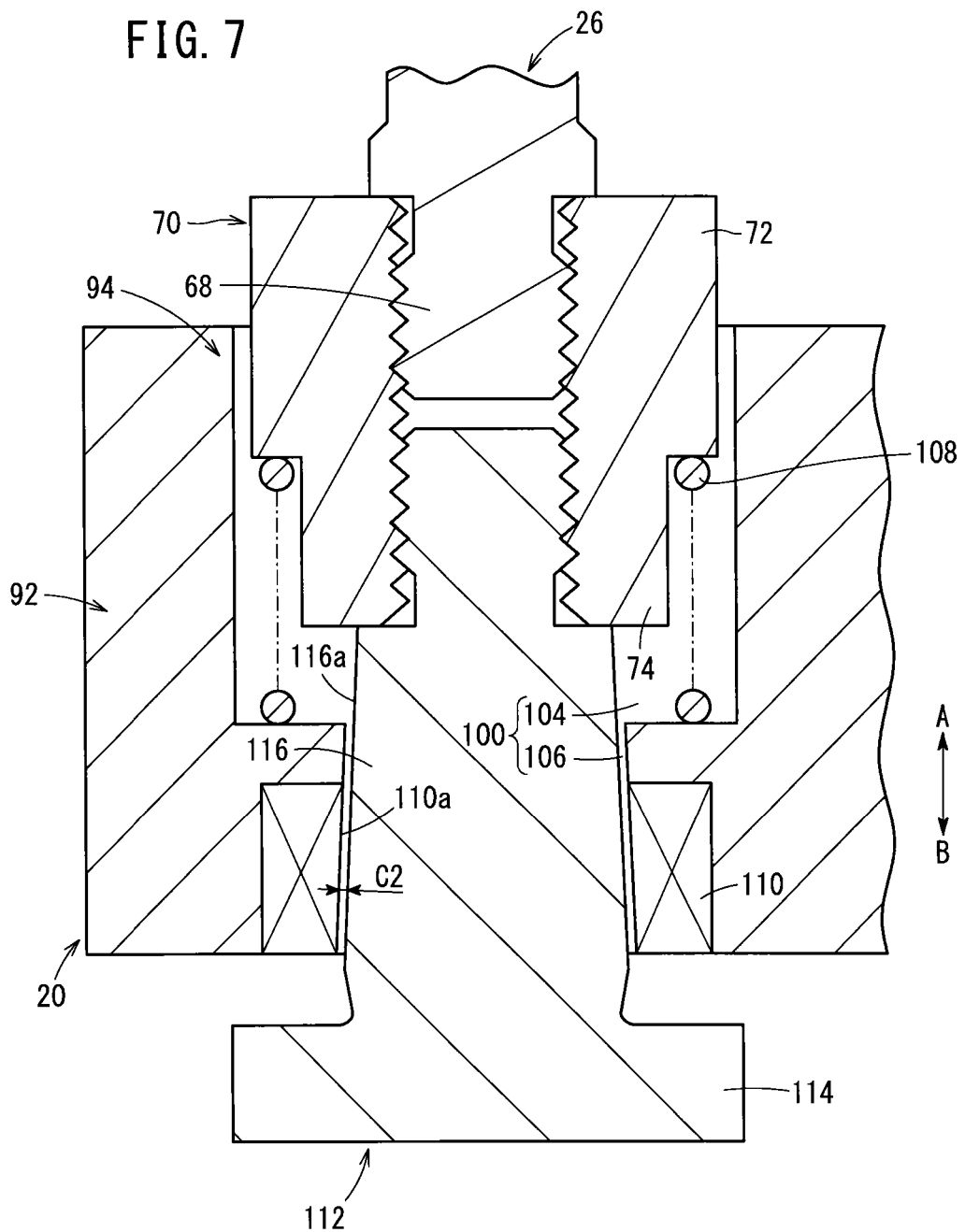
FIG. 7 is an enlarged cross sectional view showing a vicinity of a buffer rod shown in FIG. 6.

On the other hand, in a state in which downward displacement (in the direction of the arrow B) of the block body 92 is restricted, upon displacement of the piston 14, the buffer rod 112 is displaced in the axial direction (the direction of the arrow B) in opposition to the elastic force of the spring 108, whereby as shown in FIGS. 6 and 7, the head portion 114 of the buffer rod 112 separates away from the other end of the block body 92. At this time, the clearance between the rod portion 116 of the buffer rod 112 and the inner circumferential surface 110a of the bushing 110 becomes enlarged, to thereby result in a second clearance C2, which is larger than the first clearance C1 (C1<C2).

Stated otherwise, as shown in FIGS. 1 through 4, in a normal condition, in which a workpiece W is not attracted and the block body 92 remains in abutment against the head portion 114 of the buffer rod 112, the buffer rod 112 and the block body 92 are arranged with the small first clearance C1, in which the interval in the radial direction therebetween is small. Therefore, the block body 92 is positioned with high accuracy through the second cylinder hole 100 (second hole portion 106) with respect to the rod portion 116 of the buffer rod 112, and rotational movement of the block body 92 is suppressed.

On the other hand, as shown in FIGS. 6 and 7, after the suction pad 84 has been placed in abutment against the workpiece W, in the event that a load is further applied toward the side of the workpiece W (in the direction of the arrow B), since a state is brought about in which the buffer rod 112 and the block body 92 are arranged via the large second clearance C2, in which the interval therebetween in the radial direction is enlarged, even in the case that the rod portion 116 and the second cylinder hole 100 (second hole portion 106) become eccentric or offset from each other, such eccentricity can be absorbed by the interval of the second clearance C2, and displacement can proceed smoothly.

As shown in FIGS. 1 and 3, the second rod hole 102 includes an insertion hole 118, which is formed on one end side of the block body 92 (in the direction of the arrow A), and a threaded hole 120, which is formed on the other end side of the block body 92 on a straight line with the insertion hole 118. Additionally, the suction rod 18 is inserted through the insertion hole 118, and the connector 90 of the suction rod 18 is screw-engaged in the threaded hole 120. At this time, the suction rod 18 is screw-engaged such that the end of the connector 90 projects a predetermined length from the other end of the block body 92.

Further, since by being rotated with respect to the block body 92, the suction rod 18 can be advanced and retracted along the axial direction (the direction of arrows A and B) by way of threaded action with respect to the threaded hole 120, the projecting length L (see FIG. 3) at which the connector 90 projects from the other end of the block body 92 can be freely adjusted.

In addition, the suction pad 84, which is made from an elastic material such as rubber or the like, for example, is connected by screw-engagement to the connection port 86, which is formed in the center of the connector 90. Accordingly, the negative pressure fluid, which is supplied to the supply passage 88 of the suction rod 18, is supplied through the connection port 86 to the interior of the suction pad 84.

Further, a locking bolt (screw member) 122 is screw-engaged for advancement and retraction in a threaded hole provided in the side surface of the block body 92 and which extends to the insertion hole 118. The locking bolt 122 is disposed through the threaded hole in facing relation to the outer circumferential surface of the suction rod 18, such that by abutment of a distal end portion thereof against the outer circumferential surface of the suction rod 18, the locking bolt 122 functions as a locking means for restricting displacement of the suction rod 18 in the axial direction (the direction of arrows A and B). More specifically, in a state in which the locking bolt 122 is rotated to separate away from the outer circumferential surface of the suction rod 18, the suction rod 18 is rotated and the projecting length L at which the suction rod 18 projects from the other end of the block body 92 is adjusted. Further, by retightening the locking bolt 122 and bringing the locking bolt 122 into abutment against the outer circumferential surface, the suction rod 18 can be fixed with respect to the block body 92 with the projecting length L thereof in an adjusted state.

Figure 8A:
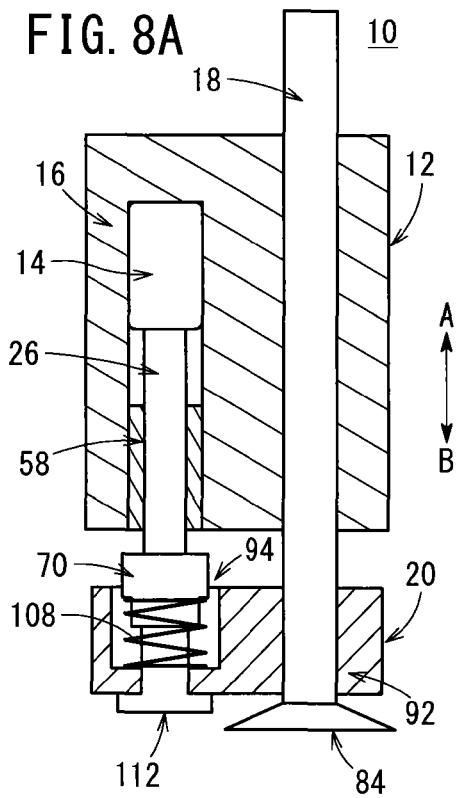
FIGS. 8A through 8D are explanatory drawings illustrating operations when a workpiece is attracted under suction by the fluid pressure cylinder of FIG. 1.

The fluid pressure cylinder 10 according to the embodiment of the present invention is constructed basically as described above. Next, operations and advantages of the present invention will be described with reference to FIGS. 8A through 8D. The condition shown in FIGS. 1, 2 and 8A, in which the piston 14 is displaced to the one end side of the body 12 (in the direction of the arrow A), will be referred to as an initial position. In this case, the first and second ports 32, 34 are connected through a switching means to a non-illustrated pressure fluid supply source, and a negative pressure supply source is connected beforehand through a tube to the negative pressure supply port 82 of the suction rod 18. A case will be described in which a workpiece W, which has been placed beneath the suction pad 84 (in the direction of the arrow B), is attracted and transported using the fluid pressure cylinder 10.

Figure 8B:
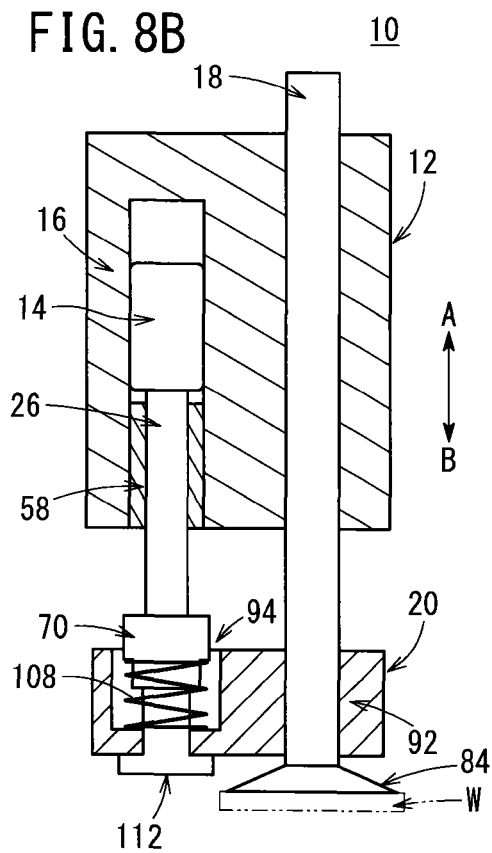

First, in the initial position, by supply of a pressure fluid to the first port 32 from a non-illustrated pressure fluid supply source, the piston 14 is displaced toward the other end side of the body 12 (in the direction of the arrow B) by the pressure fluid that is introduced into the first cylinder hole 22, accompanied by the piston rod 26 and the connecting body 70 being displaced together integrally (refer to FIG. 8B). At this time, since the elastic force of the spring 108 that is interposed between the block body 92 and the connecting body 70 is greater than the load applied from the connecting body 70, the spring 108 is not compressed, and therefore, the block body 92 is displaced integrally therewith upon displacement of the connecting body 70. In this case, the second port 34 is placed in a state of being open to atmosphere.

Further, by displacement of the block body 92, the suction rod 18, which is connected to the block body 92, is displaced integrally therewith in the axial direction (the direction of the arrow B) in a state of being supported by the bearings 28a, 28b, and the suction pad 84, which is connected to the other end of the suction rod 18, is made to approach the workpiece W.

Additionally, as shown in FIG. 8B, the piston 14 is displaced further in a downward direction (in the direction of the arrow B), accompanied by the suction pad 84 coming into abutment against the workpiece W. By further lowering the piston 14 under a condition in which the workpiece W is abutted by the suction pad 84, since the block body 92 is restricted from descending further after the suction pad 84 has abutted against the workpiece W, the additional load applied from the piston rod 26 overcomes the elastic force and compresses the spring 108, whereby only the connecting body 70 and the buffer rod 112 are lowered relatively inside the second cylinder hole 100, and the load is not transmitted to the block body 92.

Figure 8C:
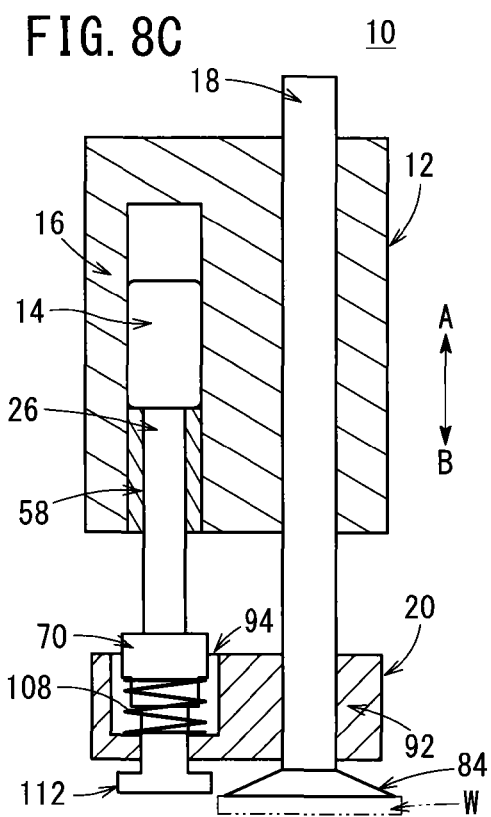

More specifically, as shown in FIGS. 6, 7, and 8C, the buffer rod 112 and the connecting body 70 are moved relatively downward (in the direction of the arrow B) with respect to the block body 92, and the block body 92, which is connected to the suction pad 84, does not move.

As a result, after the suction pad 84 has abutted against the workpiece W, even in the event that a driving force from the cylinder unit 16 is transmitted to the displacement member 20, owing to the buffer mechanism 94 of the displacement member 20, an excessive load is prevented from being applied with respect to the workpiece W. For example, when a workpiece W such as a semiconductor chip or the like, which is susceptible to excessively applied loads, is transported, by using the fluid pressure cylinder 10 having the buffer mechanism 94, application of excessive loads with respect to the workpiece W is prevented, the workpiece W can be abutted against and attracted at an optimal load, and the workpiece W can be transported safely.

Since a negative pressure is supplied through the supply passage 88 of the suction rod 18 and the connection port 86 to the interior of the suction pad 84, the workpiece W is attracted to the suction surface of the suction pad 84.

Figure 8D:
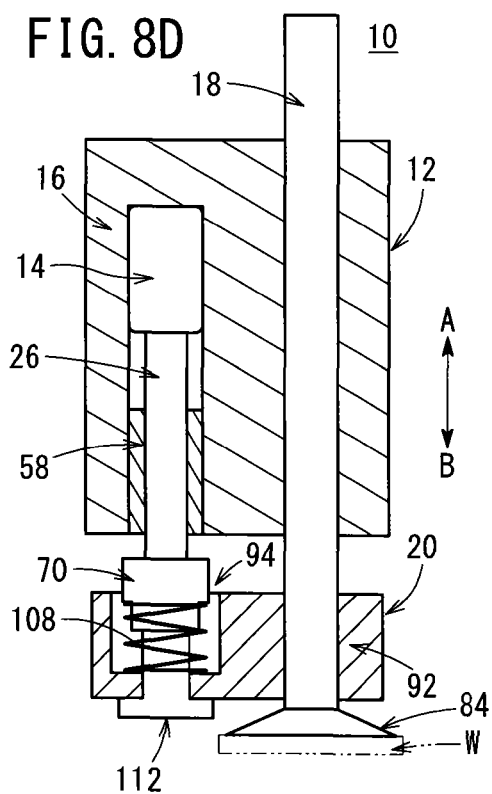

Next, after attraction of the workpiece W has been confirmed, by switching supply of the pressure fluid, which was supplied to the first port 32, to the second port 34 under operation of the non-illustrated switching means, the piston 14 is pressed upwardly (in the direction of the arrow A) by the pressure fluid supplied to the first cylinder hole 22, accompanied by the block body 92 being raised by way of the piston rod 26 so as to approach the body 12 (see FIG. 8D). As a result, in a state of being attracted to the suction pad 84, the workpiece W separates in an upward direction away from the base on which the workpiece W is placed. At this time, when the block body 92 is elevated, the suction rod 18 is displaced in an upward direction integrally with the block body 92.

In addition, after the fluid pressure cylinder 10 has been moved to a predetermined transport position by a transporting device or the like fixed to the fluid pressure cylinder 10 in a condition in which the piston 14 is raised to the one end of the first cylinder hole 22, by switching supply of the pressure fluid from the second port 34 to the first port 32, the workpiece W is lowered together with the block body 92, and in a state in which the workpiece W is placed at a predetermined position, supply of the negative pressure to the suction rod 18 from the negative pressure supply source is stopped. Consequently, the attracted state of the workpiece W on the suction pad 84 is released, and the transport operation is brought to an end with the workpiece W being placed at the predetermined position.

Further, when the load applied further from the cylinder unit 16 is buffered by the buffer mechanism 94 after the suction pad 84 has abutted against the workpiece W, by relative displacement of the buffer rod 112 in the axial direction (the direction of the arrow B) with respect to the block body 92, accompanying displacement of the block body 92, the interval in the radial direction between the rod portion 116 of the buffer rod 112 and the inner circumferential surface 110a of the bushing 110, which is formed in a tapered shape, is enlarged from the size of the first clearance C1 to the size of the second clearance C2.

As a result, for example, even in the case that the bushing 110 becomes eccentric or offset with respect to the rod portion 116 of the buffer rod 112, upon relative displacement of the buffer rod 112 with respect to the block body 92, accompanying displacement thereof in the axial direction (the direction of the arrow B), since the range of possible movement in the diametrical direction is enlarged owing to the enlarged interval of the second clearance C2, interference with displacement in the axial direction caused by contact between the rod portion 116 and the bushing 110 does not occur.

More specifically, biting in of the buffer rod 112 and the bushing 110 is avoided, and by constantly changing, i.e., increasing, the interval (second clearance C2) between the buffer rod 112 and the bushing 110, the buffer rod 112 can be displaced smoothly with respect to the block body 92.

Further, in the aforementioned embodiment, a case has been described in which both the outer circumferential surface 116a of the rod portion 116 and the inner circumferential surface 110a of the bushing 110 in the buffer rod 112 are formed in tapered shapes, which are gradually reduced in diameter toward the body 12 (in the direction of the arrow A). However, the invention is not limited to this feature, and for example, only the outer circumferential surface 116a of the rod portion 116 may be formed in a tapered shape. More specifically, the shapes are not particularly limited, insofar as a structure is provided in which, upon relative displacement in the axial direction between the buffer rod 112 and the block body 92 having the bushing 110, the mutual interval therebetween in the radial direction can be changed so as to become larger than the interval prior to displacement.

In the foregoing manner, with the present embodiment, in the fluid pressure cylinder 10, the buffer mechanism 94 is included, which is disposed on the other end of the body 12, and for example, which is capable of buffering loads applied in the axial direction (in the direction of the arrow A) when the suction pad 84 abuts against the workpiece W to transport the workpiece W. The buffer mechanism 94 includes the connecting body 70 to which a driving force from the cylinder unit 16 in the axial direction is transmitted, the block body 92 having the second cylinder hole 100 therein through which the connecting body 70 is inserted, and the buffer rod 112, which is connected to the connecting body 70 and is inserted through the second cylinder hole 100. Further, the suction rod 18 is connected to the block body 92 in parallel with the buffer rod 112, and the suction pad 84 is disposed on the connector 90 of the suction rod 18.

In addition, on the buffer rod 112, the outer circumferential surface 116a of the rod portion 116 is formed in a tapered shape, which is reduced in diameter gradually toward the connecting body 70 (in the direction of the arrow A), and the inner circumferential surface 110a of the bushing 110, which is disposed on the outer circumferential side of the rod portion 116, is formed in a tapered shape, which is reduced in diameter gradually toward the body 12 (in the direction of the arrow A).

Consequently, when the displacement member 20 is made to approach the workpiece W under a driving action of the cylinder unit 16, and the workpiece W is attracted to the suction pad 84, for example, since the interval (first clearance C1) in the radial direction between the buffer rod 112 and the bushing 110 is kept small until abutment against the workpiece W takes place, the buffer rod 112 is maintained along the axial direction with high accuracy. As a result, rotational displacement of the block body 92 about the suction rod 18 can be suppressed. Therefore, for example, when the block body 92 is raised after the workpiece W has been attracted, rotation of the block body 92 is suppressed, and accordingly rotation of the workpiece W also is prevented. Thus, in the case that a rectangular shaped workpiece such as a semiconductor chip is to be transported and placed, placement thereof on a rectangular pallet can be performed reliably.

Stated otherwise, in the case that the clearance between the piston rod and the suction pipe and the bushing is large, as in the case of the conventional fluid pressure cylinder, the workpiece W may undergo rotation together with the plate, whereby accurate placement of the rectangular workpiece on the rectangular pallet becomes difficult.

On the other hand, after the suction pad 84 has come into abutment against the workpiece W, in the case that additional loads are applied toward the side of the workpiece W, the buffer rod 112 is displaced relatively in the axial direction with respect to the block body 92, whereby the interval (second clearance C2) in the radial direction between the rod portion 116 and the bushing 110 can be enlarged.

As a result, even in the case that the second cylinder hole 100 of the block body 92 is eccentric or is offset with respect to the buffer rod 112, since such eccentricity can be absorbed by the second clearance C2, in any case, the buffer rod 112 can be displaced smoothly in the axial direction with respect to the block body 92. More specifically, even in the case that additional loads are applied to the side of the workpiece W, the buffer rod 112 is displaced relatively in the axial direction with respect to the block body 92, whereby further application of such loads can reliably be prevented, and the workpiece W can be protected from excessive loads.

More specifically, rotational movement of the block body 92 about the suction rod 18 is suppressed by the buffer mechanism 94 that is provided on the displacement member 20, while in addition, the buffer rod 112 can smoothly be displaced relatively in the axial direction with respect to the block body 92, and loads that occur upon abutment against the workpiece W can suitably be absorbed.

Stated otherwise, a structure is provided in which non-rotational precision is maintained, for keeping the block body 92 so as not to rotate about the suction rod 18, while at the same time, the buffer rod 112 can be displaced smoothly with respect to the block body 92 toward the workpiece W.

Further, by rotation of the suction rod 18, which is screw-engaged with the block body 92, the projecting length L at which the suction rod 18 projects in the axial direction (the direction of arrows A and B) from the end surface of the block body 92 can be freely adjusted. Therefore, by adjusting the relative positioning of the suction rod 18 corresponding to the position of the workpiece W, fine adjustments can be carried out without adjusting the displacement amount of the piston 14 in the cylinder unit 16.

Furthermore, by closing the machining hole 44 formed in the body 12, by the plug 46, and by contact of the o-ring 52, which is mounted inside the machining hole 44, with the plug 46, a pressure fluid or a lubricating oil or the like inside the body 12 is prevented from leaking to the exterior through the machining hole 44. As a result, dripping of lubricating oil, for example, which has leaked out to the exterior of the body 12, onto the workpiece W and adhering to the workpiece W is prevented from occurring.

Further still, since the body 12, the block body 92, and the suction rod 18 that constitute the fluid pressure cylinder 10 are formed from a conductive metal material, for example, in the event that the workpiece W, which is attracted by the suction pad 84, is statically charged, such electrostatic charge can be released or discharged to the exterior as a result of being passed conductively to the body 12 from the suction rod 18 and the block body 92. More specifically, when conveyance of the attracted workpiece W is carried out, static electricity or the like that charges the workpiece W can be grounded to the exterior.

The fluid pressure cylinder according to the present invention is not limited to the embodiment described above. It is a matter of course that various alternative or additional structures may be adopted therein without departing from the scope of the invention as set forth in the appended claims.

What is claimed is:

1. A fluid pressure cylinder comprising:
   a body having therein a cylinder chamber to which a driving fluid is supplied;
   a cylinder unit disposed in the body and which has a piston disposed displaceably in the cylinder chamber, and a piston rod connected to the piston;
   a supply rod disposed displaceably and substantially in parallel with the piston rod in the body and having a fluid passage into which a workpiece retaining fluid is supplied, with a retaining member for retaining a workpiece being installed on an end of the supply rod, the retaining member communicating with the fluid passage;
   a displacement block connected to ends of the supply rod and the piston rod, and which is displaced under a displacement action of the piston; and
   a buffer mechanism, which buffers loads applied to the displacement block, and is disposed between the displacement block and the piston rod,
   wherein the buffer mechanism includes a buffer rod, which is disposed coaxially with the piston rod and is inserted through a hole of the displacement block, an outer circumferential surface of the buffer rod being formed in a tapered shape, which is reduced gradually in diameter toward the body.

2. The fluid pressure cylinder according to claim 1, wherein the supply rod is screw-engaged with respect to the displacement block for advancement and retraction in an axial direction.

3. The fluid pressure cylinder according to claim 1, wherein a cylindrical bushing is disposed in the hole of the displacement block in facing relation to the outer circumferential surface of the buffer rod, an inner circumferential surface of the bushing being formed in a tapered shape, which is reduced gradually in diameter toward the body, such that the inner circumferential surface and the outer circumferential surface of the buffer rod are disposed substantially in parallel.

4. The fluid pressure cylinder according to claim 2, wherein a locking means for regulating displacement of the supply rod along the axial direction is disposed on the displacement block.

5. The fluid pressure cylinder according to claim 4, wherein the locking means comprises a screw member, which is disposed on the displacement block and is screw-engaged displaceably in a direction perpendicular to the axial direction, the screw member abutting against an outer circumferential surface of the supply rod.

6. The fluid pressure cylinder according to claim 1, wherein the retaining member comprises a suction pad into which the workpiece retaining fluid is supplied.

7. The fluid pressure cylinder according to claim 1, wherein upon displacement of the buffer rod relatively in the axial direction with respect to the displacement block, a clearance is enlarged between the buffer rod and the hole.

8. The fluid pressure cylinder according to claim 7, wherein a spring, which biases the buffer rod in the axial direction, is disposed between the displacement block and the buffer rod, the buffer rod and the displacement block being displaced relatively to each other when a thrust force applied in the axial direction to the buffer rod overcomes an elastic force of the spring.

9. The fluid pressure cylinder according to claim 1, wherein the body, the supply rod, and the displacement block are formed from a conductive metal material.

* * * * *